(12) United States Patent
Choy et al.

(10) Patent No.: US 9,401,300 B1
(45) Date of Patent: Jul. 26, 2016

(54) MEDIA SUBSTRATE GRIPPER INCLUDING A PLURALITY OF SNAP-FIT FINGERS

(71) Applicant: WD Media, LLC, San Jose, CA (US)

(72) Inventors: Yew Fai Choy, Skudai (MY); Hasmizan Bin Hashim, Pasir Gudang (MY); Syahrolnizam Bin Kasmon, Pasir Gudang (MY)

(73) Assignee: WD Media, LLC, San Jose, CA (US)

( * ) Notice: Subject to any disclaimer, the term of this patent is extended or adjusted under 35 U.S.C. 154(b) by 0 days.

(21) Appl. No.: 14/575,776

(22) Filed: Dec. 18, 2014

(51) Int. Cl.
| | |
|---|---|
| *B66F 19/00* | (2006.01) |
| *H01L 21/687* | (2006.01) |
| *B25J 11/00* | (2006.01) |
| *H01L 21/677* | (2006.01) |
| *B25J 15/00* | (2006.01) |
| *B24B 41/00* | (2006.01) |

(52) U.S. Cl.
CPC ........ *H01L 21/68707* (2013.01); *B24B 41/005* (2013.01); *B25J 11/0095* (2013.01); *B25J 15/0028* (2013.01); *H01L 21/67739* (2013.01)

(58) Field of Classification Search
CPC . Y10S 294/902; Y10S 294/907; B66C 1/422; B25B 9/00; B25J 15/0616; B25J 15/0009; B25J 15/0253; B25J 15/0206; B25J 11/0095; B25J 15/0028; B65G 47/90; H01L 21/68707; H01L 21/67739; B24B 41/005
USPC ......................................................... 294/213
See application file for complete search history.

(56) References Cited

U.S. PATENT DOCUMENTS

| | | | | |
|---|---|---|---|---|
| 4,591,198 | A * | 5/1986 | Monforte | B25J 13/082 294/119.1 |
| 4,601,637 | A * | 7/1986 | Aviles | B25J 15/0475 269/281 |
| 4,819,978 | A * | 4/1989 | Scheinman | B25J 13/082 294/119.1 |
| 5,360,249 | A * | 11/1994 | Monforte | B25J 15/0475 294/119.1 |
| 5,562,320 | A * | 10/1996 | Bloomberg | B25J 15/0253 294/119.1 |
| 6,013,161 | A | 1/2000 | Chen et al. | |
| 6,063,248 | A | 5/2000 | Bourez et al. | |
| 6,068,891 | A | 5/2000 | O'Dell et al. | |
| 6,086,730 | A | 7/2000 | Liu et al. | |
| 6,099,981 | A | 8/2000 | Nishimori | |
| 6,103,404 | A | 8/2000 | Ross et al. | |
| 6,117,499 | A | 9/2000 | Wong et al. | |
| 6,136,403 | A | 10/2000 | Prabhakara et al. | |
| 6,143,375 | A | 11/2000 | Ross et al. | |
| 6,145,849 | A | 11/2000 | Bae et al. | |
| 6,146,737 | A | 11/2000 | Malhotra et al. | |
| 6,149,696 | A | 11/2000 | Jia | |
| 6,150,015 | A | 11/2000 | Bertero et al. | |
| 6,156,404 | A | 12/2000 | Ross et al. | |
| 6,159,076 | A | 12/2000 | Sun et al. | |
| 6,164,118 | A | 12/2000 | Suzuki et al. | |
| 6,200,441 | B1 | 3/2001 | Gornicki et al. | |
| 6,204,995 | B1 | 3/2001 | Hokkyo et al. | |
| 6,206,765 | B1 | 3/2001 | Sanders et al. | |
| 6,210,819 | B1 | 4/2001 | Lal et al. | |
| 6,216,709 | B1 | 4/2001 | Fung et al. | |
| 6,221,119 | B1 | 4/2001 | Homola | |
| 6,248,395 | B1 | 6/2001 | Homola et al. | |
| 6,261,681 | B1 | 7/2001 | Suekane et al. | |
| 6,270,885 | B1 | 8/2001 | Hokkyo et al. | |
| 6,274,063 | B1 | 8/2001 | Li et al. | |

(Continued)

*Primary Examiner* — Stephen Vu

(57) ABSTRACT

One aspect of an assembly configured to grip a substrate includes a gripper including a first finger and a second finger, a first chuck body snap-fit to the first finger, and a second chuck body snap-fit to the second finger.

16 Claims, 6 Drawing Sheets

(56) References Cited

U.S. PATENT DOCUMENTS

| | | | |
|---|---|---|---|
| 6,283,838 | B1 | 9/2001 | Blake et al. |
| 6,287,429 | B1 | 9/2001 | Moroishi et al. |
| 6,290,573 | B1 | 9/2001 | Suzuki |
| 6,299,947 | B1 | 10/2001 | Suzuki et al. |
| 6,303,217 | B1 | 10/2001 | Malhotra et al. |
| 6,309,765 | B1 | 10/2001 | Suekane et al. |
| 6,358,636 | B1 | 3/2002 | Yang et al. |
| 6,362,452 | B1 | 3/2002 | Suzuki et al. |
| 6,363,599 | B1 | 4/2002 | Bajorek |
| 6,365,012 | B1 | 4/2002 | Sato et al. |
| 6,381,090 | B1 | 4/2002 | Suzuki et al. |
| 6,381,092 | B1 | 4/2002 | Suzuki |
| 6,387,483 | B1 | 5/2002 | Hokkyo et al. |
| 6,391,213 | B1 | 5/2002 | Homola |
| 6,395,349 | B1 | 5/2002 | Salamon |
| 6,403,919 | B1 | 6/2002 | Salamon |
| 6,408,677 | B1 | 6/2002 | Suzuki |
| 6,426,157 | B1 | 7/2002 | Hokkyo et al. |
| 6,429,984 | B1 | 8/2002 | Alex |
| 6,482,330 | B1 | 11/2002 | Bajorek |
| 6,482,505 | B1 | 11/2002 | Bertero et al. |
| 6,500,567 | B1 | 12/2002 | Bertero et al. |
| 6,528,124 | B1 | 3/2003 | Nguyen |
| 6,548,821 | B1 | 4/2003 | Treves et al. |
| 6,552,871 | B2 | 4/2003 | Suzuki et al. |
| 6,565,719 | B1 | 5/2003 | Lairson et al. |
| 6,566,674 | B1 | 5/2003 | Treves et al. |
| 6,571,806 | B2 | 6/2003 | Rosano et al. |
| 6,628,466 | B2 | 9/2003 | Alex |
| 6,664,503 | B1 | 12/2003 | Hsieh et al. |
| 6,670,055 | B2 | 12/2003 | Tomiyasu et al. |
| 6,682,807 | B2 | 1/2004 | Lairson et al. |
| 6,683,754 | B2 | 1/2004 | Suzuki et al. |
| 6,730,420 | B1 | 5/2004 | Bertero et al. |
| 6,743,528 | B2 | 6/2004 | Suekane et al. |
| 6,759,138 | B2 | 7/2004 | Tomiyasu et al. |
| 6,778,353 | B1 | 8/2004 | Harper |
| 6,795,274 | B1 | 9/2004 | Hsieh et al. |
| 6,855,232 | B2 | 2/2005 | Jairson et al. |
| 6,857,937 | B2 | 2/2005 | Bajorek |
| 6,893,748 | B2 | 5/2005 | Bertero et al. |
| 6,899,959 | B2 | 5/2005 | Bertero et al. |
| 6,916,558 | B2 | 7/2005 | Umezawa et al. |
| 6,939,120 | B1 | 9/2005 | Harper |
| 6,946,191 | B2 | 9/2005 | Morikawa et al. |
| 6,967,798 | B2 | 11/2005 | Homola et al. |
| 6,972,135 | B2 | 12/2005 | Homola |
| 7,004,827 | B1 | 2/2006 | Suzuki et al. |
| 7,006,323 | B1 | 2/2006 | Suzuki |
| 7,016,154 | B2 | 3/2006 | Nishihira |
| 7,019,924 | B2 | 3/2006 | McNeil et al. |
| 7,045,215 | B2 | 5/2006 | Shimokawa |
| 7,070,870 | B2 | 7/2006 | Bertero et al. |
| 7,090,934 | B2 | 8/2006 | Hokkyo et al. |
| 7,099,112 | B1 | 8/2006 | Harper |
| 7,105,241 | B2 | 9/2006 | Shimokawa et al. |
| 7,119,990 | B2 | 10/2006 | Bajorek et al. |
| 7,147,790 | B2 | 12/2006 | Wachenschwanz et al. |
| 7,161,753 | B2 | 1/2007 | Wachenschwanz et al. |
| 7,166,319 | B2 | 1/2007 | Ishiyama |
| 7,166,374 | B2 | 1/2007 | Suekane et al. |
| 7,169,487 | B2 | 1/2007 | Kawai et al. |
| 7,174,775 | B2 | 2/2007 | Ishiyama |
| 7,179,549 | B2 | 2/2007 | Malhotra et al. |
| 7,184,139 | B2 | 2/2007 | Treves et al. |
| 7,196,860 | B2 | 3/2007 | Alex |
| 7,199,977 | B2 | 4/2007 | Suzuki et al. |
| 7,208,236 | B2 | 4/2007 | Morikawa et al. |
| 7,220,500 | B1 | 5/2007 | Tomiyasu et al. |
| 7,229,266 | B2 | 6/2007 | Harper |
| 7,239,970 | B2 | 7/2007 | Treves et al. |
| 7,252,897 | B2 | 8/2007 | Shimokawa et al. |
| 7,277,254 | B2 | 10/2007 | Shimokawa et al. |
| 7,281,920 | B2 | 10/2007 | Homola et al. |
| 7,292,329 | B2 | 11/2007 | Treves et al. |
| 7,301,726 | B1 | 11/2007 | Suzuki |
| 7,302,148 | B2 | 11/2007 | Treves et al. |
| 7,305,119 | B2 | 12/2007 | Treves et al. |
| 7,314,404 | B2 | 1/2008 | Singh et al. |
| 7,320,584 | B1 | 1/2008 | Harper et al. |
| 7,329,114 | B2 | 2/2008 | Harper et al. |
| 7,375,362 | B2 | 5/2008 | Treves et al. |
| 7,420,886 | B2 | 9/2008 | Tomiyasu et al. |
| 7,425,719 | B2 | 9/2008 | Treves et al. |
| 7,471,484 | B2 | 12/2008 | Wachenschwanz et al. |
| 7,498,062 | B2 | 3/2009 | Calcaterra et al. |
| 7,531,485 | B2 | 5/2009 | Hara et al. |
| 7,537,846 | B2 | 5/2009 | Ishiyama et al. |
| 7,549,209 | B2 | 6/2009 | Wachenschwanz et al. |
| 7,569,490 | B2 | 8/2009 | Staud |
| 7,597,792 | B2 | 10/2009 | Homola et al. |
| 7,597,973 | B2 | 10/2009 | Ishiyama |
| 7,608,193 | B2 | 10/2009 | Wachenschwanz et al. |
| 7,632,087 | B2 | 12/2009 | Homola |
| 7,656,615 | B2 | 2/2010 | Wachenschwanz et al. |
| 7,682,546 | B2 | 3/2010 | Harper |
| 7,684,152 | B2 | 3/2010 | Suzuki et al. |
| 7,686,606 | B2 | 3/2010 | Harper et al. |
| 7,686,991 | B2 | 3/2010 | Harper |
| 7,695,833 | B2 | 4/2010 | Ishiyama |
| 7,722,968 | B2 | 5/2010 | Ishiyama |
| 7,733,605 | B2 | 6/2010 | Suzuki et al. |
| 7,736,768 | B2 | 6/2010 | Ishiyama |
| 7,755,861 | B1 | 7/2010 | Li et al. |
| 7,758,732 | B1 | 7/2010 | Calcaterra et al. |
| 7,833,639 | B2 | 11/2010 | Sonobe et al. |
| 7,833,641 | B2 | 11/2010 | Tomiyasu et al. |
| 7,910,159 | B2 | 3/2011 | Jung |
| 7,911,736 | B2 | 3/2011 | Bajorek |
| 7,924,519 | B2 | 4/2011 | Lambert |
| 7,944,165 | B1 | 5/2011 | O'Dell |
| 7,944,643 | B1 | 5/2011 | Jiang et al. |
| 7,955,723 | B2 | 6/2011 | Umezawa et al. |
| 7,983,003 | B2 | 7/2011 | Sonobe et al. |
| 7,993,497 | B2 | 8/2011 | Moroishi et al. |
| 7,993,765 | B2 | 8/2011 | Kim et al. |
| 7,998,912 | B2 | 8/2011 | Chen et al. |
| 8,002,901 | B1 | 8/2011 | Chen et al. |
| 8,003,237 | B2 | 8/2011 | Sonobe et al. |
| 8,012,920 | B2 | 9/2011 | Shimokawa |
| 8,038,863 | B2 | 10/2011 | Homola |
| 8,057,926 | B2 | 11/2011 | Ayama et al. |
| 8,062,778 | B2 | 11/2011 | Suzuki et al. |
| 8,064,156 | B1 | 11/2011 | Suzuki et al. |
| 8,076,013 | B2 | 12/2011 | Sonobe et al. |
| 8,092,931 | B2 | 1/2012 | Ishiyama et al. |
| 8,100,685 | B1 | 1/2012 | Harper et al. |
| 8,101,054 | B2 | 1/2012 | Chen et al. |
| 8,125,723 | B1 | 2/2012 | Nichols et al. |
| 8,125,724 | B1 | 2/2012 | Nichols et al. |
| 8,137,517 | B1 | 3/2012 | Bourez |
| 8,142,916 | B2 | 3/2012 | Umezawa et al. |
| 8,163,093 | B1 | 4/2012 | Chen et al. |
| 8,171,949 | B1 | 5/2012 | Lund et al. |
| 8,173,282 | B1 | 5/2012 | Sun et al. |
| 8,178,480 | B2 | 5/2012 | Hamakubo et al. |
| 8,206,789 | B2 | 6/2012 | Suzuki |
| 8,218,260 | B2 | 7/2012 | Iamratanakul et al. |
| 8,247,095 | B2 | 8/2012 | Champion et al. |
| 8,257,783 | B2 | 9/2012 | Suzuki et al. |
| 8,298,609 | B1 | 10/2012 | Liew et al. |
| 8,298,689 | B2 | 10/2012 | Sonobe et al. |
| 8,309,239 | B2 | 11/2012 | Umezawa et al. |
| 8,316,668 | B1 | 11/2012 | Chan et al. |
| 8,331,056 | B2 | 12/2012 | O'Dell |
| 8,354,618 | B1 | 1/2013 | Chen et al. |
| 8,367,228 | B2 | 2/2013 | Sonobe et al. |
| 8,383,209 | B2 | 2/2013 | Ayama |
| 8,394,243 | B1 | 3/2013 | Jung et al. |
| 8,397,751 | B1 | 3/2013 | Chan et al. |
| 8,399,809 | B1 | 3/2013 | Bourez |
| 8,402,638 | B1 | 3/2013 | Treves et al. |
| 8,404,056 | B1 | 3/2013 | Chen et al. |
| 8,404,369 | B2 | 3/2013 | Ruffini et al. |

(56) References Cited

U.S. PATENT DOCUMENTS

| | | |
|---|---|---|
| 8,404,370 B2 | 3/2013 | Sato et al. |
| 8,406,918 B2 | 3/2013 | Tan et al. |
| 8,414,966 B2 | 4/2013 | Yasumori et al. |
| 8,425,975 B2 | 4/2013 | Ishiyama |
| 8,431,257 B2 | 4/2013 | Kim et al. |
| 8,431,258 B2 | 4/2013 | Onoue et al. |
| 8,453,315 B2 | 6/2013 | Kajiwara et al. |
| 8,488,276 B1 | 7/2013 | Jung et al. |
| 8,491,800 B1 | 7/2013 | Dorsey |
| 8,492,009 B1 | 7/2013 | Homola et al. |
| 8,492,011 B2 | 7/2013 | Itoh et al. |
| 8,496,466 B1 | 7/2013 | Treves et al. |
| 8,517,364 B1 | 8/2013 | Crumley et al. |
| 8,517,657 B2 | 8/2013 | Chen et al. |
| 8,524,052 B1 | 9/2013 | Tan et al. |
| 8,530,065 B1 | 9/2013 | Chernyshov et al. |
| 8,546,000 B2 | 10/2013 | Umezawa |
| 8,551,253 B2 | 10/2013 | Na'im et al. |
| 8,551,627 B2 | 10/2013 | Shimada et al. |
| 8,556,566 B1 | 10/2013 | Suzuki et al. |
| 8,559,131 B2 | 10/2013 | Masuda et al. |
| 8,562,748 B1 | 10/2013 | Chen et al. |
| 8,565,050 B1 | 10/2013 | Bertero et al. |
| 8,570,844 B1 | 10/2013 | Yuan et al. |
| 8,580,410 B2 | 11/2013 | Onoue |
| 8,584,687 B1 | 11/2013 | Chen et al. |
| 8,591,709 B1 | 11/2013 | Lim et al. |
| 8,592,061 B2 | 11/2013 | Onoue et al. |
| 8,596,287 B1 | 12/2013 | Chen et al. |
| 8,597,723 B1 | 12/2013 | Jung et al. |
| 8,602,842 B2 | 12/2013 | Duescher |
| 8,603,649 B2 | 12/2013 | Onoue |
| 8,603,650 B2 | 12/2013 | Sonobe et al. |
| 8,605,388 B2 | 12/2013 | Yasumori et al. |
| 8,605,555 B1 | 12/2013 | Chernyshov et al. |
| 8,608,147 B1 | 12/2013 | Yap et al. |
| 8,609,263 B1 | 12/2013 | Chernyshov et al. |
| 8,619,381 B2 | 12/2013 | Moser et al. |
| 8,623,528 B2 | 1/2014 | Umezawa et al. |
| 8,623,529 B2 | 1/2014 | Suzuki |
| 8,634,155 B2 | 1/2014 | Yasumori et al. |
| 8,658,003 B1 | 2/2014 | Bourez |
| 8,658,292 B1 | 2/2014 | Mallary et al. |
| 8,665,541 B2 | 3/2014 | Saito |
| 8,668,953 B1 | 3/2014 | Buechel-Rimmel |
| 8,674,327 B1 | 3/2014 | Poon et al. |
| 8,685,214 B1 | 4/2014 | Moh et al. |
| 8,696,404 B2 | 4/2014 | Sun et al. |
| 8,711,499 B1 | 4/2014 | Desai et al. |
| 8,743,666 B1 | 6/2014 | Bertero et al. |
| 8,758,912 B2 | 6/2014 | Srinivasan et al. |
| 8,787,124 B1 | 7/2014 | Chernyshov et al. |
| 8,787,130 B1 | 7/2014 | Yuan et al. |
| 8,791,391 B2 | 7/2014 | Bourez |
| 8,795,765 B2 | 8/2014 | Koike et al. |
| 8,795,790 B2 | 8/2014 | Sonobe et al. |
| 8,795,857 B2 | 8/2014 | Ayama et al. |
| 8,800,322 B1 | 8/2014 | Chan et al. |
| 8,811,129 B1 | 8/2014 | Yuan et al. |
| 8,817,410 B1 | 8/2014 | Moser et al. |
| 8,939,487 B2 * | 1/2015 | De Koning .............. B25J 15/02 294/119.1 |
| 2002/0060883 A1 | 5/2002 | Suzuki |
| 2003/0022024 A1 | 1/2003 | Wachenschwanz |
| 2004/0022387 A1 | 2/2004 | Weikle |
| 2004/0132301 A1 | 7/2004 | Harper et al. |
| 2004/0202793 A1 | 10/2004 | Harper et al. |
| 2004/0202865 A1 | 10/2004 | Homola et al. |
| 2004/0209123 A1 | 10/2004 | Bajorek et al. |
| 2004/0209470 A1 | 10/2004 | Bajorek |
| 2005/0036223 A1 | 2/2005 | Wachenschwanz et al. |
| 2005/0142990 A1 | 6/2005 | Homola |
| 2005/0150862 A1 | 7/2005 | Harper et al. |
| 2005/0151282 A1 | 7/2005 | Harper et al. |
| 2005/0151283 A1 | 7/2005 | Bajorek et al. |
| 2005/0151300 A1 | 7/2005 | Harper et al. |
| 2005/0155554 A1 | 7/2005 | Saito |
| 2005/0167867 A1 | 8/2005 | Bajorek et al. |
| 2005/0263401 A1 | 12/2005 | Olsen et al. |
| 2006/0147758 A1 | 7/2006 | Jung et al. |
| 2006/0181697 A1 | 8/2006 | Treves et al. |
| 2006/0207890 A1 | 9/2006 | Staud |
| 2007/0070549 A1 | 3/2007 | Suzuki et al. |
| 2007/0245909 A1 | 10/2007 | Homola |
| 2008/0075845 A1 | 3/2008 | Sonobe et al. |
| 2008/0093760 A1 | 4/2008 | Harper et al. |
| 2009/0117408 A1 | 5/2009 | Umezawa et al. |
| 2009/0136784 A1 | 5/2009 | Suzuki et al. |
| 2009/0169922 A1 | 7/2009 | Ishiyama |
| 2009/0191331 A1 | 7/2009 | Umezawa et al. |
| 2009/0202866 A1 | 8/2009 | Kim et al. |
| 2009/0311557 A1 | 12/2009 | Onoue et al. |
| 2010/0143752 A1 | 6/2010 | Ishibashi et al. |
| 2010/0190035 A1 | 7/2010 | Sonobe et al. |
| 2010/0196619 A1 | 8/2010 | Ishiyama |
| 2010/0196740 A1 | 8/2010 | Ayama et al. |
| 2010/0209601 A1 | 8/2010 | Shimokawa et al. |
| 2010/0215992 A1 | 8/2010 | Horikawa et al. |
| 2010/0232065 A1 | 9/2010 | Suzuki et al. |
| 2010/0247965 A1 | 9/2010 | Onoue |
| 2010/0261039 A1 | 10/2010 | Itoh et al. |
| 2010/0279151 A1 | 11/2010 | Sakamoto et al. |
| 2010/0300884 A1 | 12/2010 | Homola et al. |
| 2010/0304186 A1 | 12/2010 | Shimokawa |
| 2011/0097603 A1 | 4/2011 | Onoue |
| 2011/0097604 A1 | 4/2011 | Onoue |
| 2011/0171495 A1 | 7/2011 | Tachibana et al. |
| 2011/0206947 A1 | 8/2011 | Tachibana et al. |
| 2011/0212346 A1 | 9/2011 | Onoue et al. |
| 2011/0223446 A1 | 9/2011 | Onoue et al. |
| 2011/0244119 A1 | 10/2011 | Umezawa et al. |
| 2011/0299194 A1 | 12/2011 | Aniya et al. |
| 2011/0311841 A1 | 12/2011 | Saito et al. |
| 2012/0069466 A1 | 3/2012 | Okamoto et al. |
| 2012/0070692 A1 | 3/2012 | Sato et al. |
| 2012/0077060 A1 | 3/2012 | Ozawa |
| 2012/0127599 A1 | 5/2012 | Shimokawa et al. |
| 2012/0127601 A1 | 5/2012 | Suzuki et al. |
| 2012/0129009 A1 | 5/2012 | Sato et al. |
| 2012/0140359 A1 | 6/2012 | Tachibana |
| 2012/0141833 A1 | 6/2012 | Umezawa et al. |
| 2012/0141835 A1 | 6/2012 | Sakamoto |
| 2012/0148875 A1 | 6/2012 | Hamakubo et al. |
| 2012/0156523 A1 | 6/2012 | Seki et al. |
| 2012/0164488 A1 | 6/2012 | Shin et al. |
| 2012/0170152 A1 | 7/2012 | Sonobe et al. |
| 2012/0171369 A1 | 7/2012 | Koike et al. |
| 2012/0175243 A1 | 7/2012 | Fukuura et al. |
| 2012/0189872 A1 | 7/2012 | Umezawa et al. |
| 2012/0196049 A1 | 8/2012 | Azuma et al. |
| 2012/0207919 A1 | 8/2012 | Sakamoto et al. |
| 2012/0225217 A1 | 9/2012 | Itoh et al. |
| 2012/0251842 A1 | 10/2012 | Yuan et al. |
| 2012/0251846 A1 | 10/2012 | Desai et al. |
| 2012/0276417 A1 | 11/2012 | Shimokawa et al. |
| 2012/0308722 A1 | 12/2012 | Suzuki et al. |
| 2013/0040167 A1 | 2/2013 | Alagarsamy et al. |
| 2013/0071694 A1 | 3/2013 | Srinivasan et al. |
| 2013/0165029 A1 | 6/2013 | Sun et al. |
| 2013/0175252 A1 | 7/2013 | Bourez |
| 2013/0216865 A1 | 8/2013 | Yasumori et al. |
| 2013/0230647 A1 | 9/2013 | Onoue et al. |
| 2013/0314815 A1 | 11/2013 | Yuan et al. |
| 2014/0011054 A1 | 1/2014 | Suzuki |
| 2014/0044992 A1 | 2/2014 | Onoue |
| 2014/0050843 A1 | 2/2014 | Yi et al. |
| 2014/0151360 A1 | 6/2014 | Gregory et al. |
| 2014/0234666 A1 | 8/2014 | Knigge et al. |

\* cited by examiner

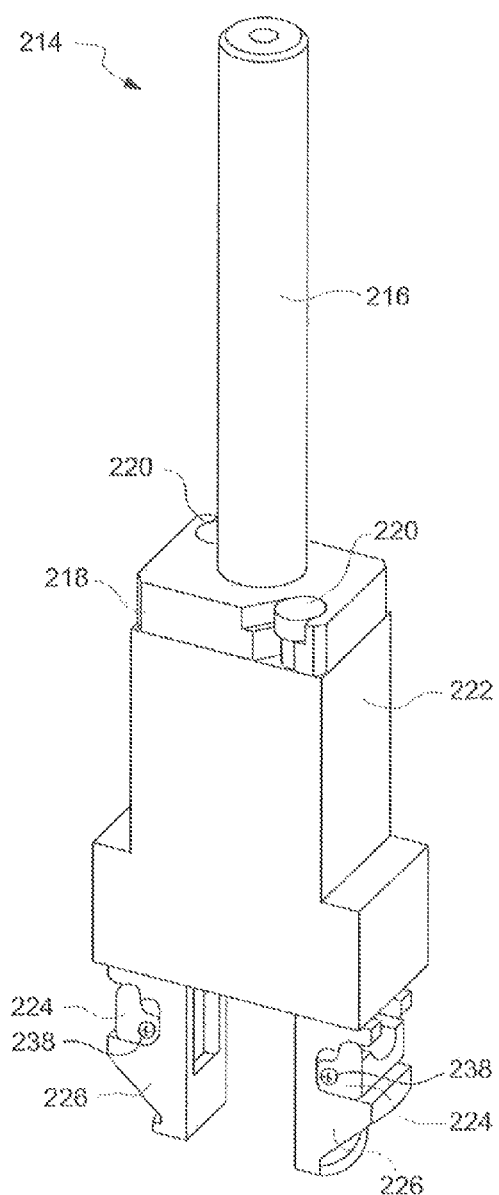
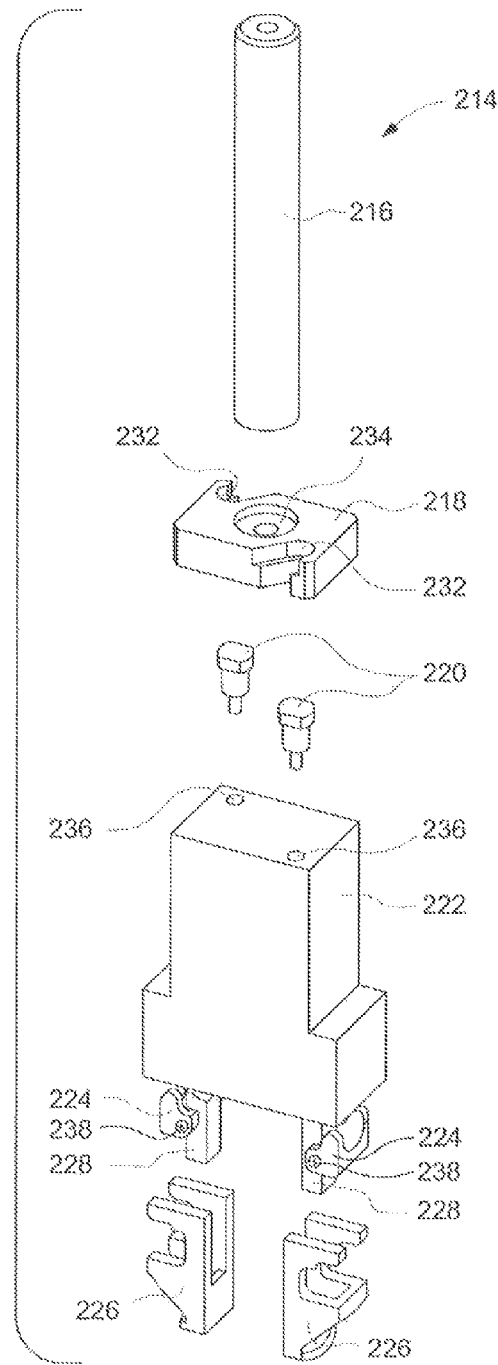
FIG. 2A
FIG. 2B

MEDIA SUBSTRATE GRIPPER INCLUDING A PLURALITY OF SNAP-FIT FINGERS

BACKGROUND

Plating, polishing, and cleaning processes are an essential part of media disk fabrication. In a media disk polishing operation, media disks are loaded in and out of a polishing machine via a transverser. For example, a transverser is an apparatus that can hold a plurality media disks simultaneously (e.g., 50 or more), and allows rapid loading and unloading of the media disks at the polisher machine to maximize machine utilization and to prevent dry-out of the polishing pad.

The transverser has a plurality of disk grippers (e.g., 50 or more) that each include a pair of chuck bodies each coupled to a respective gripper finger via a fastener such as a screw and/or a bolt. The gripper fingers of the disk gripper, when supplied with compressed air, move away from each other in a linear manner, gripping a media disk at its inner diameter. Similarly, a compressed air supply moves the fingers towards each other to release the media disk from its grip. In this way, loading and unloading of media disks from a polishing machine can be enabled.

In the event that media disks of a different form factor (e.g., 95 mm to 65 mm or vice-versa) need to be loaded into the polishing machine, the chuck body mounted on the gripper fingers will need to be changed to match the inner diameter of the media disks for proper gripping. Since a chuck body is mounted on a gripper finger via multiple fastener bolts, it takes time to change the chuck body as it involves unfastening the chuck body from the gripper finger by removing the screw and/or bolt, and then fastening a new chuck body on the gripper finger to accommodate media disks of a different form factor. The process of dismounting and attaching 50 pairs of chuck bodies will involve considerable machine downtime for each transverser, which creates a loss of production.

In addition, screw-mounted chuck bodies have screw holes with considerable tolerance, which can cause the chuck body to be mounted at the gripper finger with height differences. Therefore, height alignment during chuck body mounting is crucial to bring each of the chuck bodies' working chamfer surfaces into same working height. Failure to do this will cause the chuck bodies to be unable to pick up the disk—a "chuck miss" event. Due to inconsistencies of alignment during chuck body change, chuck body height alignment is difficult to control.

BRIEF DESCRIPTION OF THE DRAWINGS

FIG. 2A is a diagram illustrating an exemplary embodiment of a disk picker.

FIG. 2B is a diagram illustrating an exploded view of an exemplary embodiment of a disk picker.

DETAILED DESCRIPTION

Figure 1A:
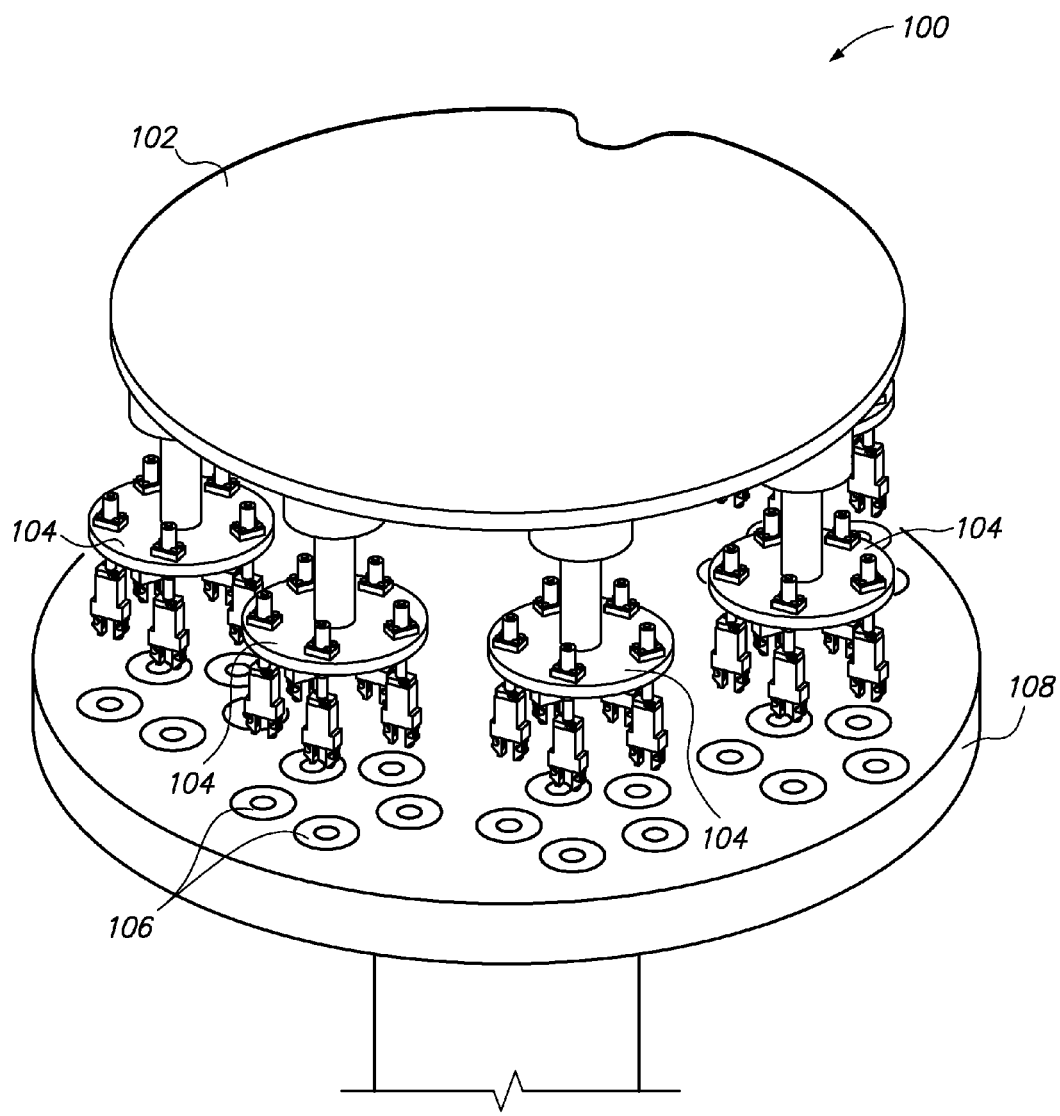
FIG. 1A is a diagram illustrating an exemplary embodiment of a substrate processing system.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

The word "exemplary" is used herein to mean serving as an example, instance, or illustration. Any embodiment described herein as "exemplary" is not necessarily to be construed as preferred or advantageous over other embodiments. Likewise, the term "embodiment" of a system, apparatus, or method does not require that all embodiments of the invention include the described components, structure, features, functionality, processes, advantages, benefits, or modes of operation.

In the following detailed description, various aspects of a media disk processing system will be presented. These aspects of a media disk processing system are well suited for dismounting and attaching various components of the processing system resulting in minimal machine downtime and reduced misalignment of machine components. Those skilled in the art will realize that these aspects may be extended to all types of media disk system components such as a chuck body, a gripper finger, an adapter, a gripper body, gripper body shafts, and/or a mount used to transfer media disks between processing machines. Accordingly, any reference to a specific system, apparatus, or method is intended only to illustrate the various aspects of the present invention, with the understanding that such aspects may have a wide range of applications.

One aspect of an assembly configured to grip a substrate includes a gripper including a first finger and a second finger, a first chuck body snap-fit to the first finger, and a second chuck body snap-fit to the second finger.

One aspect of a substrate polishing apparatus includes a supporting base configured to support a plurality of substrates during a polishing process, and a device configured to unload the plurality of substrates off of the supporting base after the polishing process, the device comprising a plurality of gripper assemblies each configured to grip a substrate, each gripper assembly comprising a gripper including a first finger and a second finger, a first chuck body snap-fit to the first finger, and a second chuck body snap-fit to the second finger.

One aspect of an assembly configured to receive a plurality of substrates during a recording media fabrication process includes a base comprising a first adapter and a second adapter, and a mount snap-fit to the first adapter and the second adapter, the mount configured to receive the plurality of substrates during the recording media fabrication process.

It will be understood that other aspects of the present invention will become readily apparent to those skilled in the art from the following detailed description, wherein it is shown and described only several embodiments of the invention by way of illustration. As will be realized by those skilled in the art, the present invention is capable of other and different embodiments and its several details are capable of modification in various other respects, all without departing from the spirit and scope of the invention.

Figure 1B:
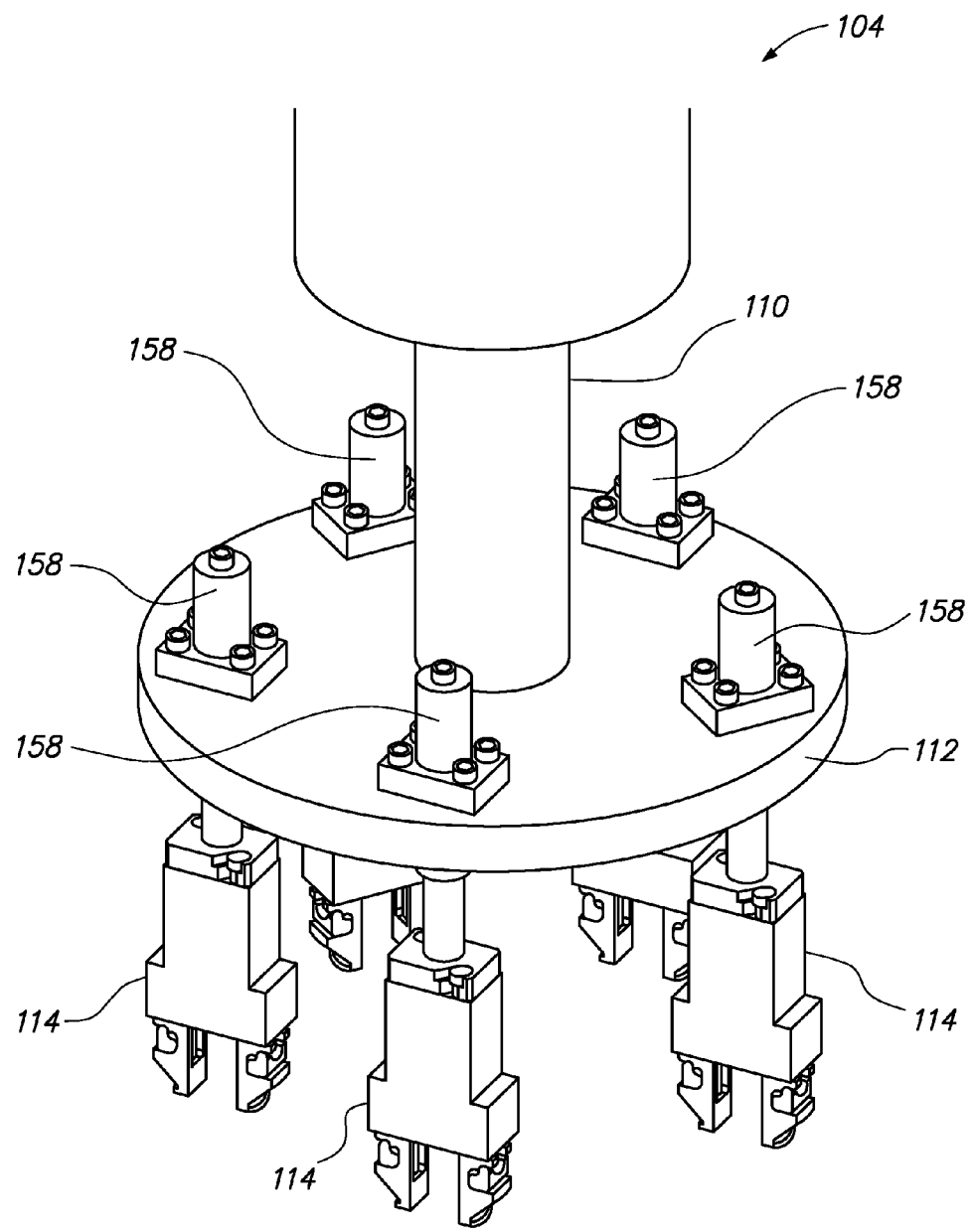
FIG. 1B is a diagram illustrating an exemplary embodiment of a media disk gripper.

FIG. 1A is a diagram illustrating a media disk processing system 100 according to an exemplary embodiment. For example, the media disk processing system 100 can include a media disk processing machine 108 configured to polish a plurality of media disks 106, such as a recording media substrate, during a polishing process. With reference to FIG. 1A, the media disk processing system 100 can include a transverser 102 that is used to load and unload a plurality of media disks 106 into and out of the media disk processing machine 108. The transverser 102 can include a plurality of gripper assemblies 104 each comprising one or more disk pickers 114, a more detailed view of which can be seen in FIG. 1B. As illustrated in FIG. 1B, a gripper assembly 104 can be attached to the transverser 102 via a shaft 110 that is coupled to a support plate 112. One or more disk pickers 114, seen in FIG. 1B, can be mounted to the support plate 112. For example, the disk pickers 114 can each be coupled to the support plate 112 using a slide bush 158, and the slide bush 158 can be coupled to the support plate 112 using one or more screws or bolts. In an exemplary embodiment, each of the one or more disk pickers 114 are configured to grip a respective media disk 106 during a loading/unloading process into and out of the media disk processing machine 108.

FIG. 2A is a diagram illustrating an exemplary embodiment of a disk picker 214 in accordance with an exemplary embodiment of the present disclosure. FIG. 2B is an exploded view of the disk picker 214 illustrated in FIG. 2A. Referring to FIG. 2A, the disk picker 214 can include a picker shaft 216 coupled to a mount 218. For example, the picker shaft 216 can be coupled to the mount 218 using one or more screws, bolts, adhesives, or the like. Alternately, the picker shaft 216 can form a unitary structure with the mount 218. As seen in FIG. 2A, a gripper body 222 is coupled to the mount 218 using a pair of adapters 220. For example, each of the pair of adapters 220 can be configured to be received into a respective cavity 236 in the gripper body 222. Referring FIG. 2B, the mount 218 can include a pair of recesses 232, each of which is configured to receive one of the pair of adapters 220 of the gripper body 222. In an exemplary embodiment, each of the recesses 232 in the mount 218 can be shaped to substantially mirror the external contour of the adapters 220 and configured to receive one of the pair of adapters 220 in a snap-fit manner. For example, each of the recesses 232 can be shaped and configured such that at least one wall of each of the recesses 232 flexes outwardly allowing its respective adapter 220 to be received therein. Once the adapter 220 is fully received within its respective recess 232, the walls of the recess 232 flex back into their original position providing the required interference to securely retain the adapter 220 within the recess 232 to couple the gripper body 222 to the mount 218. In this way, the gripper body 222 can be attached to the mount 218 in a snap-fit manner. The gripper body 222 can be detached from the mount 218 by applying a sufficient force to the outer wall of the recess 232 (e.g., by twisting the gripper body 222) that allows the outer wall of the recess 232 to flex away from the adapter 220, and the adapters 220 to slide out of its respective recess 232. This decouples the gripper body 222 from the mount 218. In this way, a gripper body 222 can be easily and quickly changed into and out of a disk picker 214.

Figure 4A:
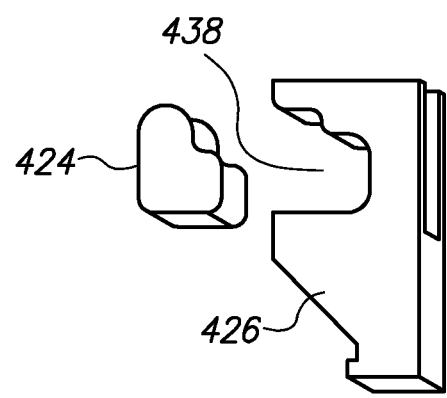
FIGS. 4A and 4B are diagrams illustrating an exemplary embodiment of matching contours of the adapter of a gripper finger.
Figure 4B:
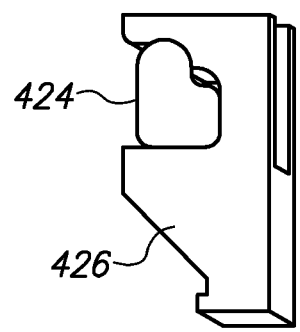

With further reference to FIG. 2B, the gripper body 222 also includes a pair of gripper fingers 228 that are configured to move away from one another in a linear manner, when supplied with compressed air. In an exemplary embodiment, each of the gripper fingers 228 include an adapter 224 coupled thereto. For example, the adapter 224 can be attached to its respective gripper finger 228 using a screw 238, a bolt (e.g., not shown), an adhesive (e.g., not show), or the like. Alternately, the adapter 224 can be integrally formed with the gripper finger 228, such that the gripper finger 228 and its adapter 224 form a unitary member. As illustrated in FIG. 2A, a pair of chuck bodies 226 can each be mounted to one of the gripper fingers 228 (seen in FIG. 2B). In an exemplary embodiment, each of the chuck bodies 226 includes a recess that is shaped to mirror the external contour of the adapter 224. For example, with reference to FIG. 4, the recess 438 formed in the chuck body 426 is shaped and sized to match the outer contour of the adapter 424 that allows for precise alignment of each of the chuck bodies 426. In this way the chuck body 426 can mate with the adapter in a snap-fit configuration with high height precision. Referring again to FIGS. 2A and 2B, each chuck body 226 can also include an internal groove (not shown) that is shaped and configured to fit around a gripper finger 228. In this way, the chuck body 226 can be attached to the gripper finger 228 in a snap-fit manner.

Figure 3A:
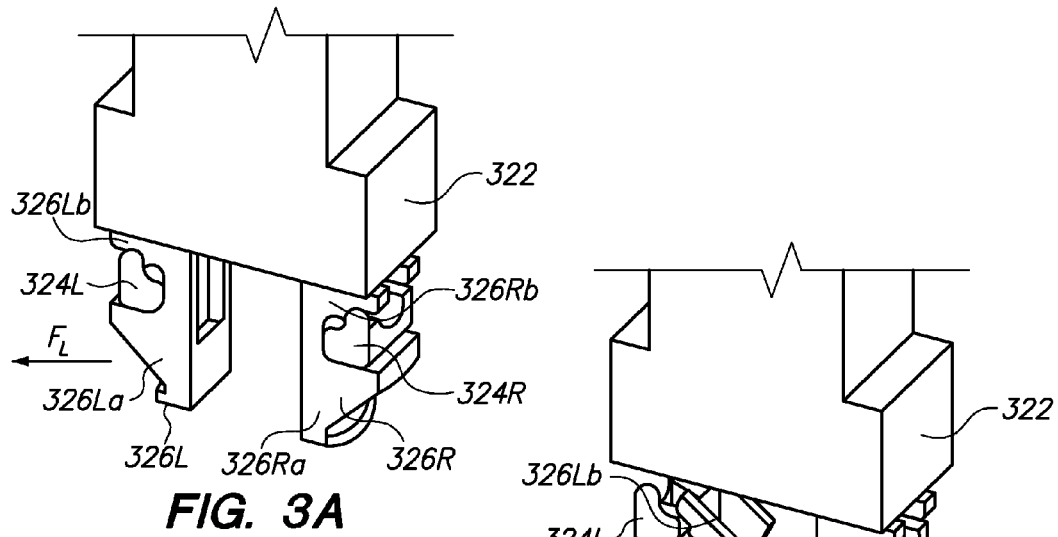
FIGS. 3A-3D are diagrams illustrating an exemplary embodiment for removing a chuck body from a gripper finger.
Figure 3B:
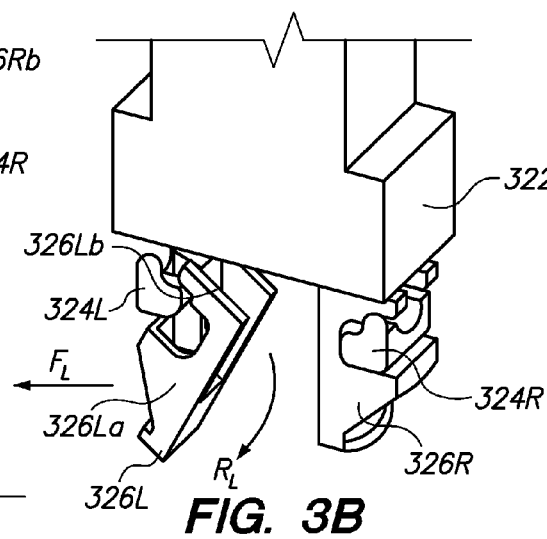
Figure 3C:
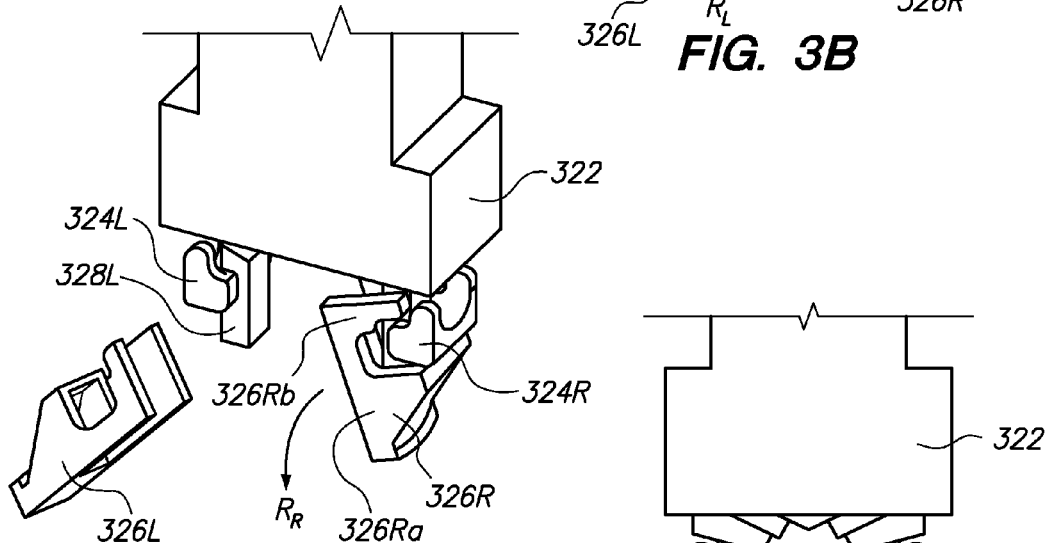
Figure 3D:
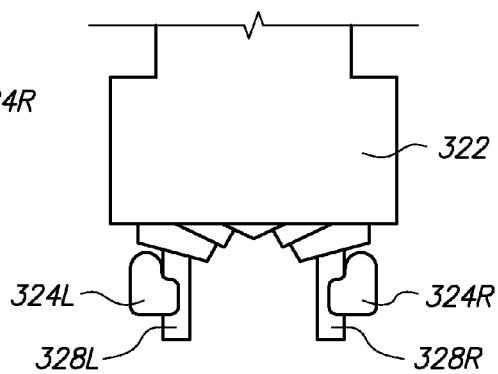

FIGS. 3A-3D illustrate an exemplary embodiment for dismounting the chuck bodies 326L, 326R coupled to the gripper fingers 328 of a gripper body 322 in accordance with one aspect of the present disclosure. With reference to FIG. 3A, a force $F_L$ can be applied to a lower portion 326La of the left chuck body 326L in an outward direction with respect to the gripper body 322. When the applied outward force $F_L$ is of sufficient strength, the upper portion 326Lb of the left chuck body 326L disengages from the left adapter 324L mounted on the left gripper finger 328L. This causes rotation $R_L$ of the left chuck body 326L away from the left gripper finger 324L as depicted in FIGS. 3B-3D. Similarly, to remove the right gripper chuck 326R, a force $F_R$ can be applied to a lower portion 326Ra of the right gripper chuck 326R in an outward direction with respect to the gripper body 322. When the applied outward force $F_R$ is of sufficient strength, the upper portion 326Rb disengages from the right adapter 324R mounted on the right gripper finger 328R. This causes rotation $R_R$ of the right chuck body 326R away from the right gripper finger 324R as depicted in FIGS. 3C and 3D. In this way, the snap-fit configuration allows each of the chuck bodies 326L, 326R to be efficiently removed from its respective gripper finger 328L, 328R.

Figure 5:
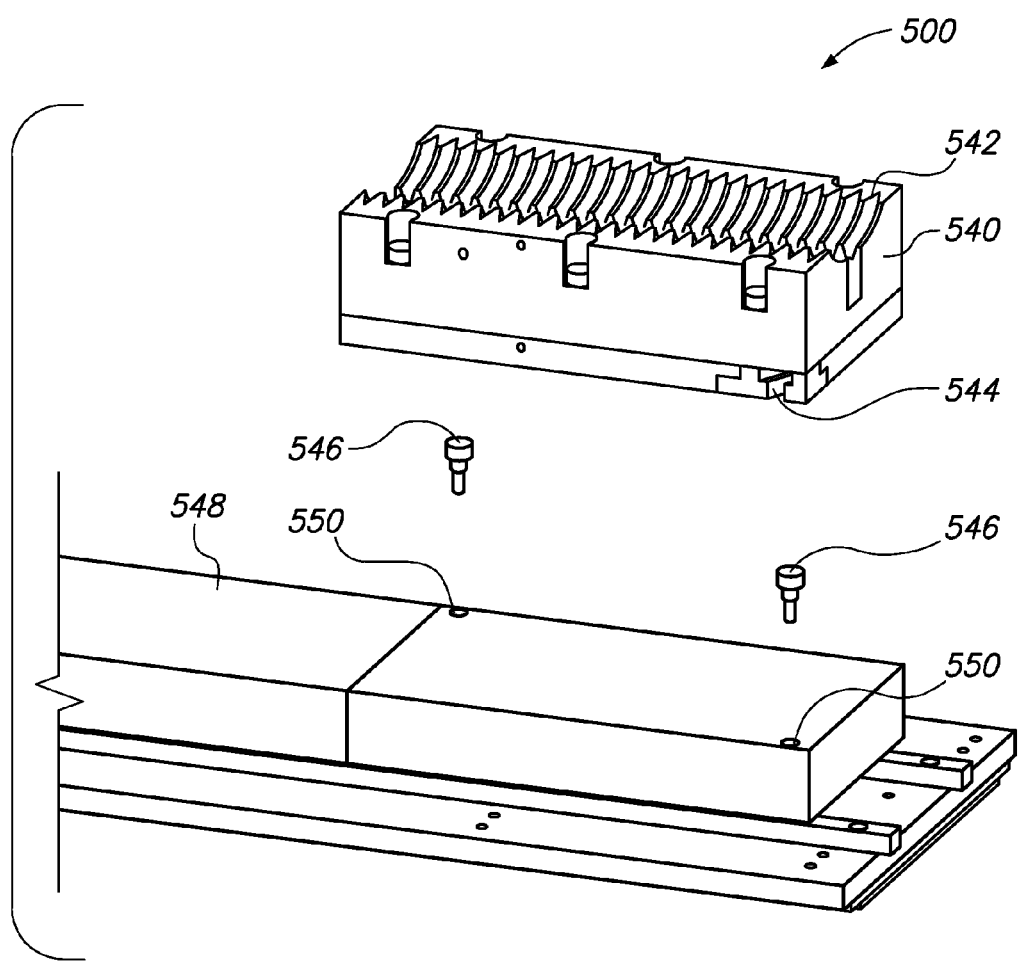
FIG. 5 is a diagram illustrating an exploded view of a media disk gripper including a snap fit mount according to an exemplary embodiment.

FIG. 5 is a diagram illustrating an exploded view of an assembly 500 configured to receive a plurality of media disks during a recording media fabrication process. The assembly 500 can include a mount 540 that includes a plurality of slots 542, each configured to receive a media disk (not shown). The mount 540 can be coupled to a moveable base 548 with a pair of adapters 546. As illustrated in FIG. 5, the mount 540 can include a pair of recesses 544, each of which is configured to receive one of the pair of adapters 546. For example, each of the pair of adapters 546 can be configured to be received into a respective cavity 550 in the moveable base 548. In an exemplary embodiment, the pair of recesses 544 in the mount 540 are each shaped based on the external contour of an adapter 546 and configured to receive one of the adapters 546 in a snap-fit manner. For example, each of the recesses 544 can be shaped and configured such that at least one wall of each of the recesses 544 flexes outwardly allowing its respective adapter 546 to be received therein. Once the adapter 546 is fully received within its respective recess 544, the walls of the recess 544 flex back into their original position providing the required interference to "lock" the adapter 546 within the recess 544. In this way, the mount 540 can be coupled to the moveable base 548 in a snap-fit manner. The mount 540 can be detached from the moveable base 548 by applying a force to the outer wall of the recess 544 (e.g., by twisting the mount 540) that is sufficient to allow the outer wall to flex away from the adapter 546 as it slides out of the recess 544. In this way, the mount 540 used to receive media disks (not shown) in a recording media fabrication process can be easily switched out with another component (e.g., a different mount having the same or different specifications as mount 540).

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. An assembly configured to grip a substrate, the assembly comprising:
    a gripper including a first finger and a second finger;
    a first adapter coupled to the first finger using a first screw mechanism;
    a second adapter coupled to the second finger using a second screw mechanism;
    a first chuck body snap-fit to the first finger; and
    a second chuck body snap-fit to the second finger.

2. The assembly of claim 1, wherein:
    the first chuck body includes a first recess configured to receive the first adapter when the first chuck body is coupled to the first adapter; and
    the second chuck body includes a second recess configured to receive the second adapter when the second chuck body is coupled to the second adapter.

3. The assembly of claim 2, wherein:
    the first adapter includes a first external contour and the first recess of the first chuck body is formed with a shape matching the external contour of the first adapter; and
    the second adapter includes a second external contour and the second recess of the second chuck body is formed with a shape matching the second external contour of the second adapter.

4. The assembly of claim 2, further comprising:
    a mount snap-fit to the gripper; and
    a shaft coupled to the mount.

5. The assembly of claim 4, further comprising a third adapter coupled to the gripper, wherein the mount includes a third recess configured to receive the third adapter when the mount is coupled to the gripper.

6. The assembly of claim 1, wherein:
    the first chuck body includes a first chamfer surface configured to engage with the substrate; and
    the second chuck body includes a second chamfer surface configured to engage with the substrate.

7. The assembly of claim 6, wherein the first finger and the second finger are configured to move in opposing directions with respect to one another when supplied with compressed air causing the first chamfer surface and the second chamfer surface to mechanically grip the substrate.

8. A substrate polishing apparatus, comprising:
    a supporting base configured to support a plurality of substrates; and
    a device configured to unload the plurality of substrates off of the supporting base, the device comprising:
        a plurality of gripper assemblies each configured to grip a substrate, each gripper assembly comprising:
            a gripper including a first finger and a second finger;
            a first adapter coupled to the first finger using a first screw mechanism;
            a second adapter coupled to the second finger using a second screw mechanism;
            a first chuck body snap-fit to the first finger; and
            a second chuck body snap-fit to the second finger.

9. The apparatus of claim 8, wherein:
    the first chuck body includes a first recess configured to receive the first adapter when the first chuck body is coupled to the first finger; and
    the second chuck body includes a second recess configured to receive the second adapter when the second chuck body is coupled to the second finger.

10. The apparatus of claim 9, wherein:
    the first adapter includes a first external contour and the first recess of the first chuck body is formed with a shape matching the external contour of the first adapter; and
    the second adapter includes a second external contour and the second recess of the second chuck body is formed with a shape matching the second external contour of the second adapter.

11. The apparatus of claim 9, further comprising:
    a mount snap-fit to the gripper; and
    a shaft coupled to the mount.

12. The apparatus of claim 11, further comprising a third adapter coupled to the gripper, wherein the mount includes a third recess configured to receive the third adapter when the mount is coupled to the gripper.

13. The apparatus of claim 8, wherein:
    the first chuck body includes a first chamfer surface configured to engage with the substrate; and
    the second chuck body includes a second chamfer surface configured to engage with the substrate.

14. The apparatus of claim 13, wherein the first finger and the second finger are configured to move in opposing directions with respect to one another when supplied with compressed air causing the first chamfer surface and the second chamfer surface to mechanically grip the substrate.

15. An assembly configured to receive a plurality of substrates during a recording media fabrication process, the assembly comprising:
    a base comprising a first adapter and a second adapter; and
    a mount comprising a plurality of curved grooves each configure to retain a substrate, a first recess and a second recess, the mount coupled to the first adapter and the second adapter,
        wherein the first recess is positioned around the first adapter and the second recess is positioned around the second adapter.

16. The assembly of claim 15, wherein:
    the first adapter includes a first external contour and the first recess of the mount is formed with a shape matching the external contour of the first adapter; and
    the second adapter includes a second external contour and the second recess of the mount is formed with a shape matching the second external contour of the second adapter.

* * * * *